United States Patent [19]

Bottomley et al.

[11] Patent Number: 4,973,908
[45] Date of Patent: Nov. 27, 1990

[54] NMR PROBE WITH MULTIPLE ISOLATED COPLANAR SURFACE COILS

[75] Inventors: Paul A. Bottomley, Clifton Park; Christopher J. Hardy, Schenectady, both of N.Y.

[73] Assignee: General Electric Company, Schenectady, N.Y.

[21] Appl. No.: 370,518

[22] Filed: Jun. 23, 1989

[51] Int. Cl.[5] ............................................. G01R 33/20
[52] U.S. Cl. .................................................... 324/318
[58] Field of Search ............... 324/318, 322, 309, 307, 324/300

[56] References Cited

U.S. PATENT DOCUMENTS

| | | | |
|---|---|---|---|
| 4,721,913 | 1/1988 | Hyde et al. | 324/318 |
| 4,793,356 | 12/1988 | Misic et al. | 324/318 |
| 4,816,765 | 3/1989 | Boskamp | 324/318 |
| 4,857,850 | 8/1989 | Mametsa et al. | 324/318 |

Primary Examiner—Hezron E. Williams
Assistant Examiner—Louis M. Arana
Attorney, Agent, or Firm—Marvin Snyder; James C. Davis, Jr.

[57] ABSTRACT

An NMR antenna probe has at least one substantially circular surface coil arranged in a plane and a surface coil having substantially a Figure-8 shape, substantially coplanar with the at least one circular surface coil. The Figure-8 coil has a cross-over portion which is located substantially coaxial with the axis of the at least one circular surface coil. The coil corresponding to the least-NMR-sensitive nucleus is circular, while the non-circular coil corresponds to the most-NMR-sensitive nucleus. The circular coil is positioned on the side of the NMR probe closest to the subject to be studied.

16 Claims, 1 Drawing Sheet

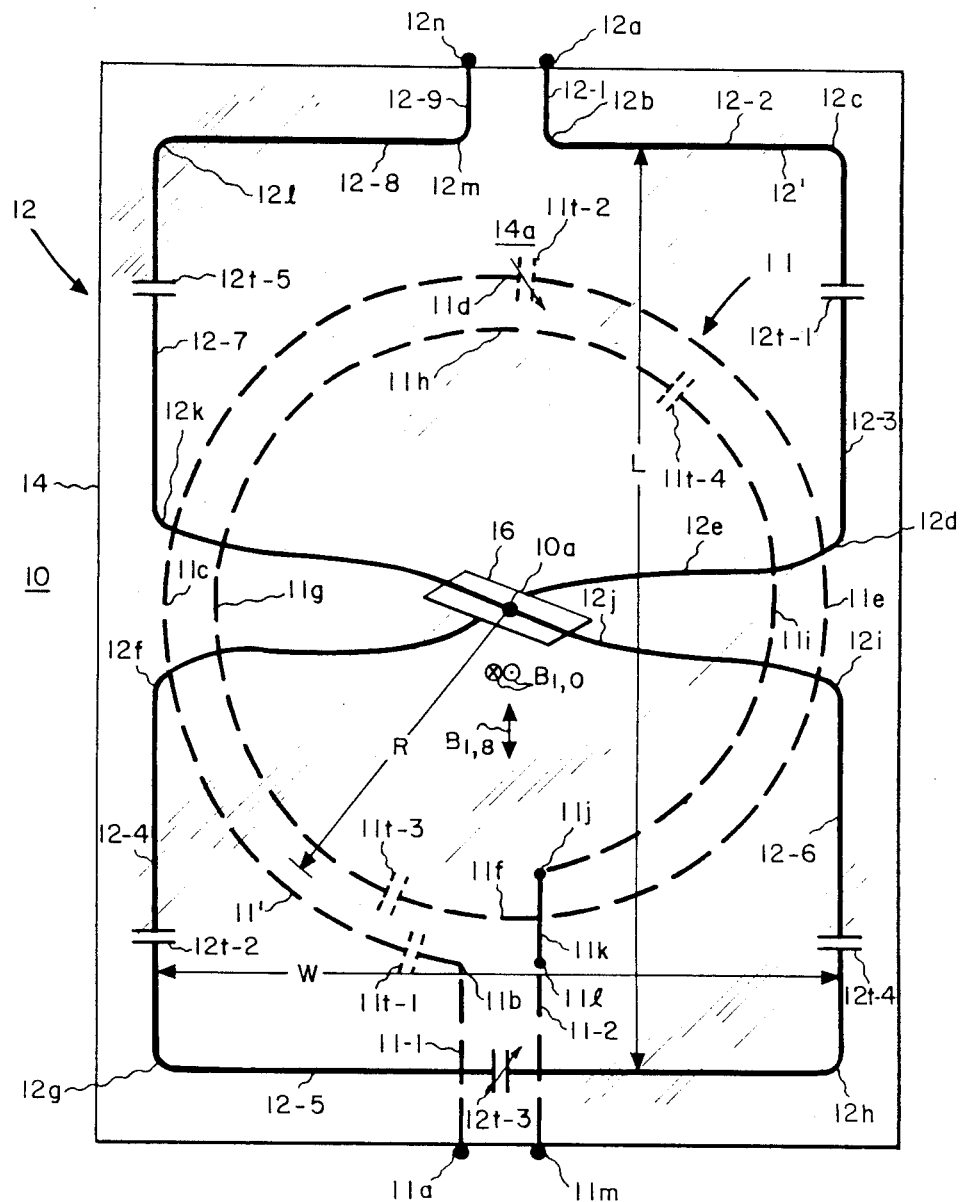

NMR PROBE WITH MULTIPLE ISOLATED COPLANAR SURFACE COILS

BACKGROUND OF THE INVENTION

The present invention relates to nuclear magnetic resonance (NMR) apparatus and, more particularly, to novel NMR antenna probes utilizing a plurality of surface coils, (i.e. a conductor or a plurality of conductors, with or without added impedance elements, which are arranged and substantially confined initially to a flat plane, even if that flat plane is later to be conformed to the shape of a sample of interest, for actual use in exciting and/or detecting/receiving NMR signals), arranged in substantially coaxial and coplanar geometry and having improved electronic isolation therebetween.

It is well known to utilize surface coils as NMR reception (or detection) antennae, particularly for spectroscopic studies of the head, torso and the like, because such coils provide a better signal-to-noise ratio than volume coils. Surface coils are also commonly used for excitation in spectroscopic studies because the excitation field is more localized, so that less radio-frequency (RF) power is required. Due to increased bandwidth requirements, the RF power required to stimulate NMR nuclei other than hydrogen ($^1$H) may become excessive; in some cases, this leads to undesirable RF power levels in the sample (e.g. a human body portion) under study, as nuclei such as phosphorus ($^{31}$P) or carbon ($^{13}$C) are studied. It is highly desirable to utilize simple circular or polygonal surface coils for reception, as these surface coils are most sensitive in such studies. It is often desirable to utilize separate surface coils for transmission of the excitation signal and for reception of the NMR response signal. Situations in which separate transmission/reception surface coils may be used include: heteronuclear NMR studies, where one coil is used for exciting a first species of nucleus, and a second coil is used for exciting and/or detecting a second species of nucleus, as in a $^1$H-decoupled, nuclear Overhauser enhanced, in vivo $^{13}$C experiment, or in a $^1$-decoupled in vivo $^{31}$P experiment; in a heteronuclear NMR study where a first coil is tuned and used for excitation of $^1$H images and a second coil is used for excitation and/or detection of NMR spectroscopy signals from the sample; in a homonuclear study utilizing selective irradiation of one chemical species with a first coil and utilizing a second coil for excitation and/or detection of NMR signals from at least one chemically different species of the same NMR nucleus; or a homonuclear study where a first coil is used for excitation (e.g. to provide a uniform excitation field over a region of a sample), and a second coil is utilized for detection. The foregoing experiment types encompass the vast majority of NMR spectroscopy studies performed at this time.

It is also well known that use of a pair of circular or polygonal surface coils, positioned to produce fields that are substantially coaxial with one another, provide a degree of mutual electrical coupling between the coils which seriously compromises performance of the probe utilizing the pair of coils. Often, the performance of the higher-frequency coil (i.e. that surface coil tuned to the higher NMR frequency, e.g. to the $^1$H frequency) is rendered useless, and diode-blocking or other active blocking networks cannot be employed for decoupling studies. Thus, in $^1$H-decoupled spectroscopy, where a high level decoupling signal must be provided during the time interval when spectra are actually acquired, the mutual interaction between the decoupling coil and spectra-reception coils will prevent acquisition of the NMR response signal by the latter (detection) coil. It is therefore highly desirable to provide a NMR probe antenna, having a plurality of surface coils, in which at least a pair of the surface coils do not substantially interact, even though those coils are substantially coplanar and coaxial with one another.

BRIEF SUMMARY OF THE INVENTION

In accordance with the invention, a NMR antenna probe comprises: at least one surface coil, of spiral or substantially circular form, is arranged in a plane; and a surface coil having a substantially non-circular shape, located substantially coplanar with the at least one circular surface coil, having a center portion which is located substantially coaxial with the axis of the at least one circular surface coil, and providing a RF field substantially orthogonal to the RF field provided by each of the at least one substantially circular surface coil. The coil corresponding to the least-NMR-sensitive nucleus is of substantially-circular form, while the non-circular coil (sensitive to the field perpendicular to that of the substantially-circular coil(s)) corresponds (is tuned) to the most-NMR-sensitive nucleus. The circular coil is positioned on the side of the NMR probe closest to the subject to be studied.

In a presently preferred embodiment, one multiple-turn circular surface coil of about 6.5 centimeter diameter is positioned in front of a non-circular and substantially-coplanar FIG.-8 surface coil having a width of about 8 centimeters and a length of about 13 centimeters, to provide mutual coupling interaction on the order of a magnitude less (e.g. about 6%) than the coupling interaction between a pair of similarly sized but substantially coplanar and coaxial circular surface coils tuned to the same frequencies.

Accordingly, it is an object of the present invention to provide a NMR probe antenna having at least one surface coil of a first group with reduced mutual coupling interaction to a coplanar surface coil of another group.

This and other objects of the present invention will become apparent upon reading of the following detailed description, when considered in conjunction with the drawing Figure.

BRIEF DESCRIPTION OF THE DRAWING

The sole drawing figure is a plan view of a NMR probe antenna in accordance with the present invention.

DETAILED DESCRIPTION OF A PRESENTLY PREFERRED EMBODIMENT OF THE INVENTION

Referring to the sole figure, a presently preferred embodiment of a NMR antenna probe 10 utilizes a multiple-turn, substantially circular surface coil 11 (which includes spiral-shaped coils) of a first group of at least one surface coil; coil 11 (shown here in broken line) has a reduced mutual coupling interaction with another surface coil antenna 12 of another surface coil group. The circular surface coil 11 is tuned, as by a plurality of (capacitive) tuning elements 11$t$-1 through 11$t$-4, to a first NMR frequency, of a lesser-NMR-sensitive species (such as $^{13}$C, $^{31}$P, and the like) of nuclei or of the NMR species of primary interest, while the non-circular surface coil 12 is tuned, as by a plurality of tuning devices 12t-1 through 12t-5, to the most-NMR-sensitive nuclear species (e.g. $^1H$) or of a species of less interest utilized in the study. The at least one circular surface coil 11 is positioned on a surface of a thin, rigid, insulative, non-magnetic sheet 14 closest to the subject to be studied, while the non-circular surface 12 is positioned on that sheet surface 14a furthest from the sample coils 11 and 12 can be etched from separated layers of conductive material, each fabricated on an opposite side of sheet 14.

The substantially-circular surface coil(s) 11 include any surface coil with substantially coplanar windings, of less than, equal to or more than a single turn, with any shape which produces an RF magnetic field $B_{1,0}$ in a direction perpendicular to the plane of the winding(s) of the coil. Substantially-circular coils specifically include regular geometrically shaped coils of E equal sides (where E is at least 1). Thus, substantially-circular coils can have E=1 side (circle/spiral), E=2 sides (substantially symmetric ellipsoid), E=3 sides (substantially symmetric triangles), E=4 sides (substantially symmetric squares) and so forth; hexagonal (E=6) and octagonal (E=8) shapes may be particularly useful, as more closely approximating a circular shape. Surface coil 11 may be a single surface coil or a plurality of substantially coaxial and coplanar surface coils. A single surface coil of two circular-spiral turns is illustrated, although single turn surface coils, or coils with more turns, can be equally as well utilized. The illustrated multiple-turn circular-spiral coil 11 is formed about a central axis 10a of the probe, which happens to coincide with the center of sheet 14. A first circularspiral-shaped surface coil end 11a is connected by an extended conductive portion, 11-1 to starting point 11b of the circular turns. The circular coil portion 11' includes a first reactive tuning element 11t-1 in the first quarter-turn portion 11c thereof. Another reactive tuning element 11t-2 (here, a variable tuning element) may be provided in a second or third quarter-turn portion 11d or 11e, with further reactive (preferably capacitive) tuning elements 11t-3, 11t4, . . . in the subsequent coil sections 11f, 11g, 11i, . . . After completion of at least one turn, the circular portion of the coil ends at point 11j, and a jumper conductor portion 11k is brought through to the other side of the insulative member 14, to a point 11l, at which point the conductor returns to the first side of the insulative member, where a second conductive extended portion 11-2 is utilized to bring the circular surface coil to its termination point 11m. Suitable cable, impedance matching and/or balanced-to-unbalanced transformation means can be attached to the circular surface coils terminals 11a/11m, as well known to the art. In a presently preferred embodiment, the average radius R of the circular surface coil is about 3 and one-quarter centimeters.

The non-circular surface coil 12 is illustratively of a FIG.-8 configuration, so that its RF field is $B_{1,8}$ in the plane of sheet 14 and is therefore essentially orthogonal to the RF field $B_{1,0}$ (into and out of the sheet 14 plane) which the circular surface coil 11 would produce, if each of surface coils 11 and 12 were similarly, but individually, excited by the same RF signals used with the circular/non-circular probe. FIG.-8 surface coil 12 commences at a first terminal 12a, which is connected by a first conductive extended lead portion 12-1, to a first coil point 12b. The FIG.-8 coil conductor 12' has a first section 12-2 extending in a first direction (e.g. having initially, along the width of insulative sheet 14) to a first outer corner 12c. Another section 12-3 is integrally joined thereto and extends in a direction (e.g. vertically along the length of sheet 14) substantially perpendicular to the direction in which section 12-2 extends. At a first inner corner 12d, a slanted section 12e traverses across the member 14 to an opposite inner corner 12f, at which a section 12-4 commences. Section 12-4 is parallel to section 12-3, being in the same (e.g. vertical, or lengthwise) direction. The coil conductor 12' turns substantially perpendicular at a left bottom outer corner 12g, diagonally opposite top right outer corner 12c, with respect to the probe center point 10a (which is also the center of both coils 11 and 12). A bottom portion 12-5 extends from corner 12g to an opposite, outer right outer corner 12h, with another portion 12-6 extending upwardly therefrom towards portion 12-3, until a third inner corner 12i is reached. Thereafter, a second slanted traverse portion 12j crosses the sheet, with an insulative cross-over portion 12e occurring substantially in the region of probe center point 10a, and facilitated by a sheet 16 of an insulation material. The second cross-over portion 12j turns at a fourth inner corner 12k, going through a final vertical section 12-7, before turning at a top left outer corner 12l and going through a final horizontal section 12-i until final corner 12m is turned and a second extended conductive section 12-9 brings the FIG.-8 coil to its second terminal 12n. A plurality of reactive means, such as capacitors 12t-1 through 2t-5, are used to tune coil 12 to the required NMR frequency here, variable capacitor 12t-3 is centrally located and used to fine tune to the $^1H$ frequency. It will be understood that additional balanced conductive means, impedance matching means and/or balanced-to-unbalanced RF means can be utilized, in manner well known to the art, to affect connection of a coaxial RF cable to the external-connection terminals 12a and 12n of the FIG.-8 coil 12. By way of illustration only, with a circular coil having average radius R of about 3 and one-quarter centimeters, a FIG.-8 coil 12 having a width W of about 8 centimeters and a length L of about 13 centimeters has proved useful in conducting $^1H/^{31}P$ studies in a 1.5 Tesla NMR spectroscopy system. It will be appreciated that any FIG.-8 pattern of two crossing loops, with curved or straight conductive sections, can be used, as long as the magnetic field $B_{1,8}$ thereof is substantially parallel to the plane of the loop sections; multiple turns can also be used. The coil need not be symmetrical about either axis, as any mutual coupling introduced by coil asymmetry may be minimized by adjustment of the locations of the coils with respect to one another, but within the common plane.

While the present invention has been described herein in detail with respect to a presently preferred embodiment thereof, many modifications and variations therein will now become apparent to those skilled in the art. Specifically, each probe, while described as being formed substantially in a flat plane, is contemplated for use by warping/bending the initially-planar probe into a shape conforming to the surface of an object to be studied. Accordingly, it is our intent to be limited only by the scope of the appending claims and not by the specific details and instrumentalities presented by way of explanation herein.

What is claimed is:

1. A nuclear-magnetic-resonance (NMR) antenna probe, comprising:
   at least one surface coil having a substantially circular shape, each arranged substantially in a common plane and having a substantially common axis, and providing a RF field substantially prependicular to said common plane; and a substantially non-circular surface coil, arranged about said common axis and substantially in said common plane, tuned to a nuclear species of greater NMR sensitivity than any nuclear species to which any of said at least one substantially-circular surface coil is tuned and providing a RF field substantially orthogonal to the RF field provided by each of the at least one substantially-circular surface coil.

2. The probe of claim 1, wherein the non-circular surface coil is positionable further from a sample-to-be-studied than is any of the at least one substantially-circular surface coil.

3. The probe of claim 2, wherein at least one of the substantially-circular surface coil is a spiral-shaped coil having a plurality of turns.

4. The probe of claim 3, wherein the non-circular surface coil has a FIG.-8 shape, with a cross-over portion of the coil being arranged along said common axis.

5. The probe of claim 4, wherein the FIG.-8 coil has a width of about 8 cm. and a length of about 13 cm.

6. The probe of claim 5, wherein one substantially-circular coil has a diameter of about 6.5 cm.

7. The probe of claim 1, wherein the conductor of each of said at least one substantially-circular surface coil is etched from a first layer of conductive material; the conductor of said substantially non-circular surface coil is etched from a second layer of conductive material; and an insulative layer, of thickness at least an order of magnitude less than the diameter of any substantially-circular coil, separates the first and second conductive material layers.

8. A nuclear-magneticresonance (NMR) antenna probe comprising:

at least one surface coil having a substantially circular shape, each arranged substantially in a common plane and having a substantially common axis, and providing a RF field substantially perpendicular to said common plane;

a substantially non-circular surface coil, arranged about said common axis and substantially in said common plane, tuned to a nuclear species of greater NMR sensitivity than any nuclear species to which any of said at least one substantially-circular surface coil is tuned and providing a RF field substantially orthogonal to the RF field provided by each of said at least one substantially-circular surface coil; and an insulative member supporting the totality of surface coils.

9. The probe of claim 8, wherein the non-circular surface coil is adjacent to a first surface of said member, which first surface is different from a second surface adjacent to which said at least one substantially-circular surface coil is positioned.

10. The probe of claim 9, wherein the non-circular surface coil is positioned further from a sample-to-be-studied than is any of the at least one substantially-circular surface coil.

11. The probe of claim 10, wherein at least one of the substantially-circular surface coil has a plurality of turns.

12. The probe of claim 11, wherein the non-circular surface coil has a FIG.-8 shape, with a cross-over portion of the coil being arranged along said common axis.

13. The probe of claim 12, wherein the FIG.-8 coil has a width of about 8 cm. and a length of about 13 cm.

14. The probe of claim 13, wherein one substantially-circular coil has a diameter of about 6.5 cm.

15. The probe of claim 8, wherein each surface coil is tuned to a different frequency.

16. The probe of claim 8, wherein each surface coil is tuned to a common frequency.

* * * * *